(12) United States Patent
Chan et al.

(10) Patent No.: US 7,557,498 B2
(45) Date of Patent: Jul. 7, 2009

(54) SYSTEM FOR DISPLAYING IMAGES INCLUDING ELECTROLUMINESCENT DEVICE AND METHOD FOR FABRICATING THE SAME

(75) Inventors: Chuan-Yi Chan, Taipei (TW); Chang-Ho Tseng, Sinwu Township (TW)

(73) Assignee: TPO Displays Corp., Chu-Nan (TW)

( * ) Notice: Subject to any disclaimer, the term of this patent is extended or adjusted under 35 U.S.C. 154(b) by 362 days.

(21) Appl. No.: 11/436,679

(22) Filed: May 17, 2006

(65) Prior Publication Data

US 2007/0284584 A1 Dec. 13, 2007

(51) Int. Cl.
*H01J 1/62* (2006.01)

(52) U.S. Cl. ........................ 313/498; 313/504
(58) Field of Classification Search .......... 313/504–512
See application file for complete search history.

(56) References Cited

U.S. PATENT DOCUMENTS

| 6,337,232 | B1 | 1/2002 | Kusumoto et al. |
| 6,517,504 | B1 * | 2/2003 | Postelmans ................. 602/26 |
| 6,876,001 | B2 | 4/2005 | Koo et al. |
| 6,927,418 | B2 | 8/2005 | Hotta |
| 2004/0188683 | A1 * | 9/2004 | Hotta ......................... 257/59 |
| 2005/0212403 | A1 | 9/2005 | Tsai et al. |

\* cited by examiner

*Primary Examiner*—Joseph L Williams
(74) *Attorney, Agent, or Firm*—Liu & Liu

(57) ABSTRACT

The invention discloses a system for displaying images comprising an organic electroluminescent device. The organic electroluminescent device comprises a pixel area including a plurality of sub-pixels, a switching TFT having a first silicon layer with a first thickness and a driving TFT having a second silicon layer with a second thickness. Each sub-pixel includes a switching region with a switching TFT thereon and a driving region with a driving TFT thereon. Specifically, a difference between the first thickness and the second thickness at least exceeds 10%. Fabrication methods of the system are also provided.

12 Claims, 11 Drawing Sheets

SYSTEM FOR DISPLAYING IMAGES INCLUDING ELECTROLUMINESCENT DEVICE AND METHOD FOR FABRICATING THE SAME

BACKGROUND OF THE INVENTION

1. Field of the Invention

The present invention relates to an electroluminescent device and a method for fabricating the same, and in particular relates to an active matrix organic electroluminescent device with various channel thickness and fabrication method thereof.

2. Description of the Related Art

Recently, with the development and wide application of electronic products such as mobile phones, PDAs, and notebook computers, there has been increasing demand for flat display devices that consume less power and occupy less space. Organic electroluminescent devices are self-emitting and highly luminous, with wider viewing angle, faster response speed, and a simple fabrication process, making them an industry display of choice.

Organic light-emitting diodes (OLED) utilize an organic electroluminescent layer. The trend in organic electroluminescent display technology is for higher luminescent efficiency and longer lifetime. As a result, an active matrix organic electroluminescent device with thin film transistors has been developed to solve the aforementioned problems. The active matrix organic electroluminescent device has panel luminescence with thin and lightweight characteristics, spontaneous luminescence with high luminescent efficiency and low driving voltage, and advantages of increased viewing angle, high contrast, high-response speed, flexibility and full color. As the need for larger display devices with higher resolution grows, active matrix organic electroluminescent devices are poised to achieve a major market trend.

As to conventional formation of electroluminescent devices, semiconductor layers are mainly formed at a uniform thickness due to simplicity of process. That is, semiconductor layers of peripheral driving circuits of a panel, or of TFTs and storage capacitors in a sub-pixel may be formed simultaneously to a desired thickness. For example, U.S. Pat. No. 6,337,232 discloses a fabrication method of a crystalline silicon thin film semiconductor with a thin channel region. In the presented electroluminescent device, a semiconductor film including silicon is formed. After crystallization of the semiconductor film followed by patterning of the crystallized semiconductor film, a maker part and an insular part are formed simultaneously. Specifically, a part of the semiconductor film to become a channel formation region is thinned to a thickness of 300 angstroms or less.

Conventional electroluminescent devices, however suffer from problems such as the so-called "mura" effect induced by various electric field effect mobility of driving TFTs among sub-pixels. Accordingly, an electroluminescent device capable of solving the aforementioned problems is desirable.

BRIEF SUMMARY OF THE INVENTION

In view of the aforementioned problems, one embodiment of the invention discloses a system for displaying images comprising a display panel with an active matrix organic electroluminescent device. The active matrix organic electroluminescent device comprises a pixel area including a plurality of sub-pixels, a switching TFT having a first silicon layer with a first thickness and a driving TFT having a second silicon layer with a second thickness. Each sub-pixel includes a switching region with a switching TFT thereon and a driving region with a driving TFT thereon. Specifically, a difference between the first thickness and the second thickness at least exceeds 10%. In other embodiments, difference in thickness may be between 10% and 200%, 10% and 150%, 10% and 100%, 10% and 70%, or 10% and 40%.

The system of other embodiments of the invention further comprises an electronic device including a display panel and an input unit coupled to the display panel. The input unit provides input to the display panel such that the display panel displays images. The electronic device can be a mobile phone, digital camera, PDA (personal digital assistant), notebook computer, desktop computer, television, car display, or portable DVD player.

As a result of the thickness difference between channels of the switching TFT and driving TFT in a same sub-pixel, the electric field effect mobility of TFTs can be adjustable. Specifically, the electric field effect mobility of the driving TFT can be reduced when a thicker channel region thereof, compared to that of the switching TFT, is formed. Accordingly, a well driving current distribution among the driving TFTs is obtained, and OLED elements can emit light uniformly. Besides, the peripheral driving circuit in a display panel can employ various poly-Si thicknesses depending on consideration of electric properties.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is the best-contemplated mode of carrying out the invention. This description is made for the purpose of illustrating the general principles of the invention and should not be taken in a limiting sense. The scope of the invention is best determined by reference to the appended claims.

Figure 1:
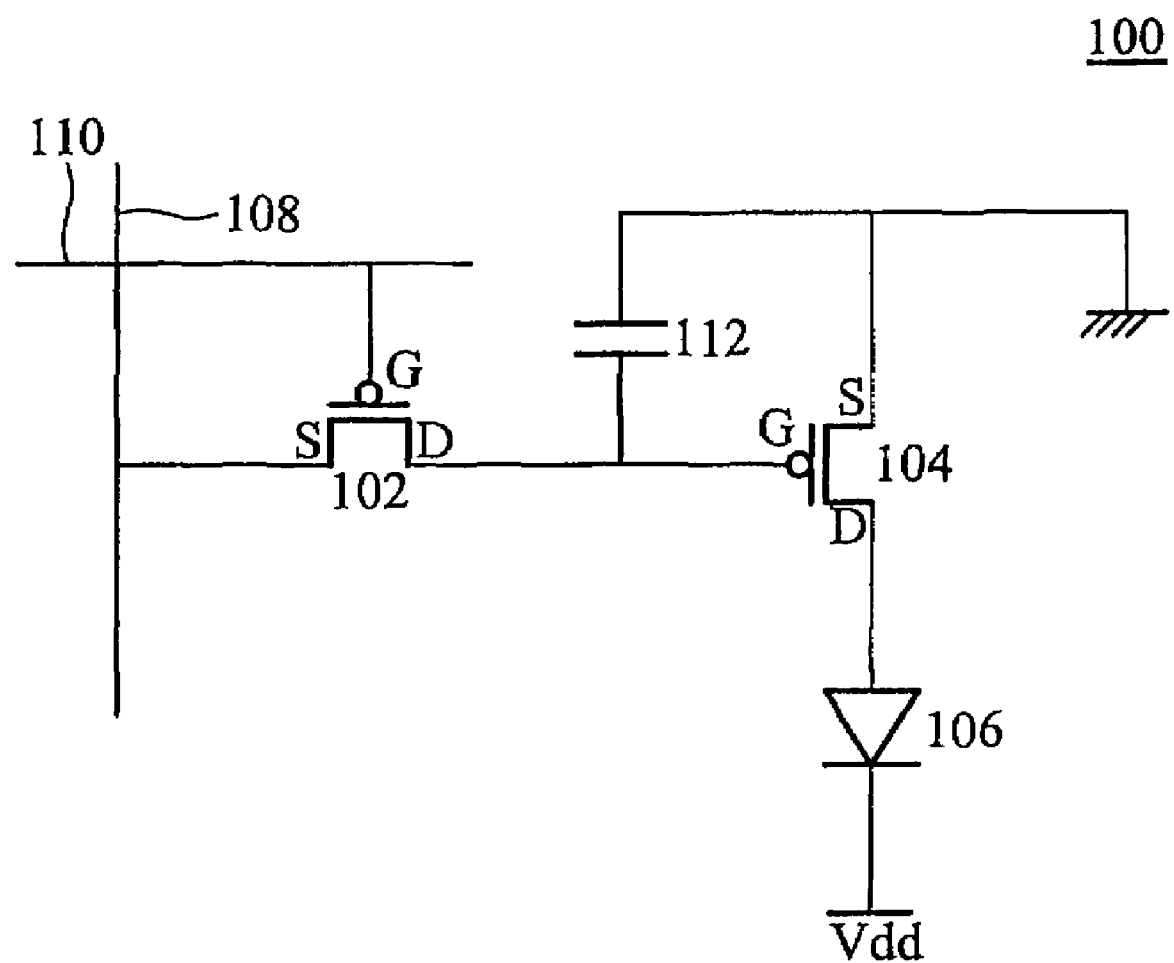
FIG. 1 is an equivalent circuit of a sub-pixel of an active matrix organic electroluminescent device.

FIG. 1 is an equivalent circuit of a sub-pixel of an active matrix organic electroluminescent device. It is noted that each "sub-pixel" hereinafter includes a switching region with a switching TFT thereon and a driving region with a driving TFT thereon.

As shown in FIG. 1, in a pixel area (not shown) including a plurality of sub-pixels, one sub-pixel 100 comprises a switching TFT 102, a driving TFT 104, an organic light emitting diode 106, a data line 108, a scan line 110, and a storage capacitor 112. The organic light emitting diode 106 further comprises an anode electrode, an electroluminescent layer and a cathode electrode (not shown).

First Embodiment

FIGS. 2a~2g are cross sections showing an embodiment of a method for fabricating a system for displaying images incorporating an active matrix organic electroluminescent device.

Figure 2A:
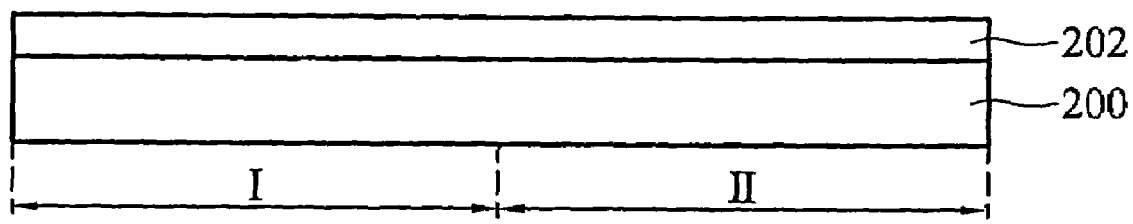
FIGS. 2a~2g are cross sections showing an embodiment of a method for fabricating a system for displaying images incorporating an active matrix organic electroluminescent device.

As shown in FIG. 2a, a substrate 200, e.g. a glass substrate, a quartz substrate or a plastic substrate, is provided with a buffer layer 202 thereon. The substrate 200 includes a switching region I and a driving region II.

Figure 2B:
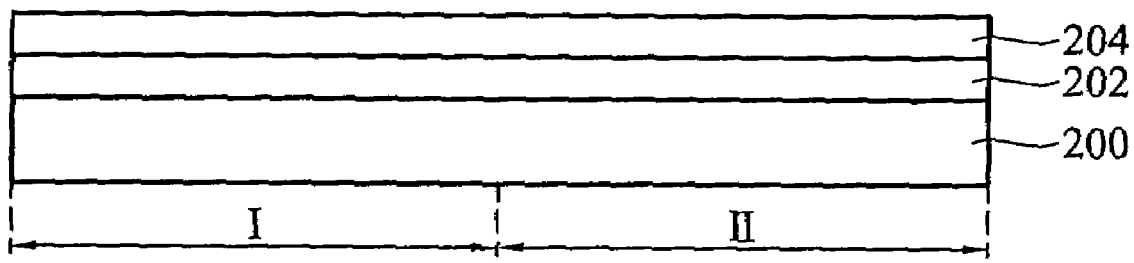

As shown in FIG. 2b, an amorphous silicon layer 204 is deposited on the buffer layer 202.

Figure 2C:
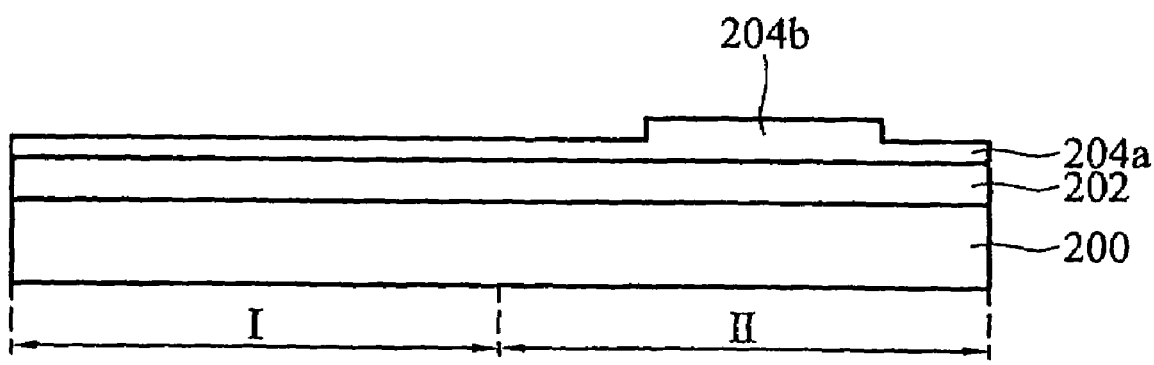

As shown in FIG. 2c, a patterned amorphous silicon layer 204a including a protrusion 204b in the driving region II is formed after a photolithography process (not shown).

Figure 2D:
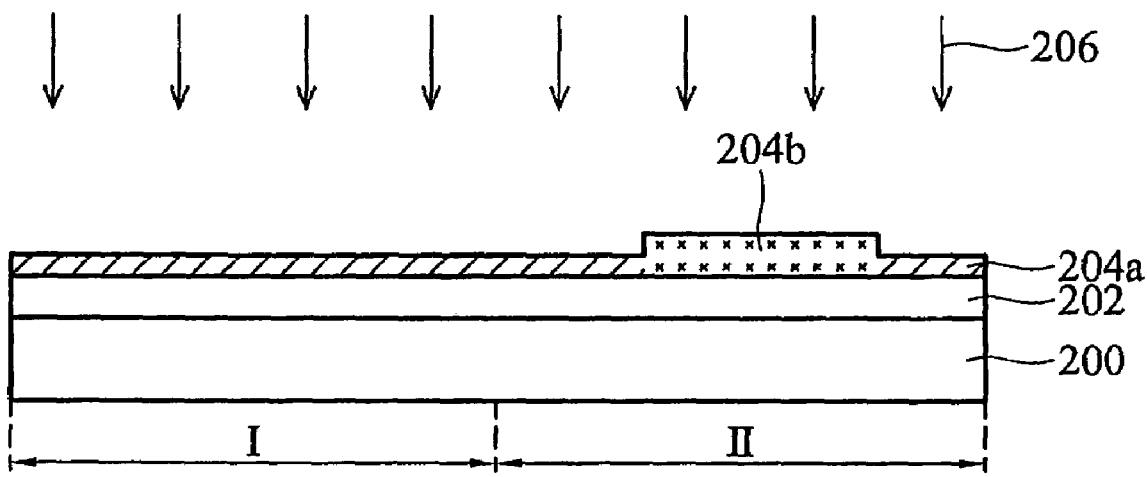

As shown in FIG. 2d, an ELA 206, i.e. eximer laser annealing, is conducted on the amorphous silicon layer 204a, making crystallization thereof. The grain size of the crystallized protrusion 204b' is relatively smaller than that of the other portion of the crystallized amorphous silicon layer 204a', i.e. polysilicon layer 204a' due to difference in their thicknesses at a same laser energy density. In other embodiments, other crystallization treatments such as Solid Phase Crystallization (SPC) or Metal Induced Lateral Crystallization (MILC) can be utilized.

Figure 2E:
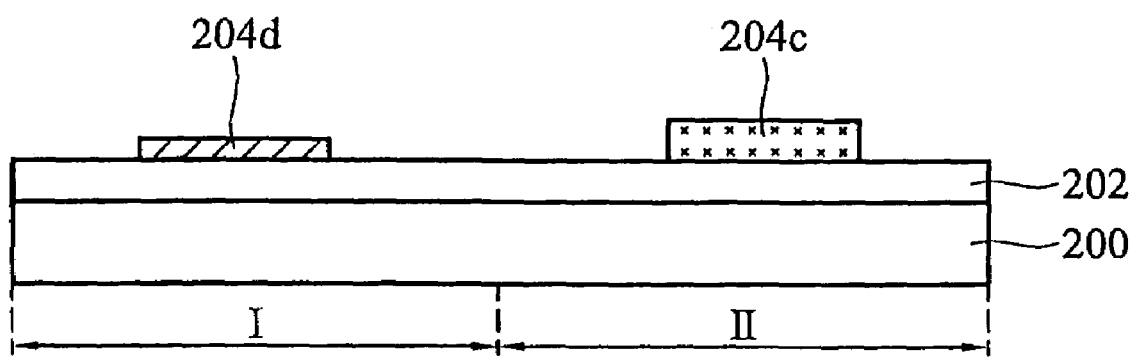

As shown in FIG. 2e, a polysilicon layer 204d in the switching region I and a polysilicon layer 204c in the driving region II are simultaneously formed by means of a photolithography process (not shown). Specifically, the polysilicon layer 204c has a thickness relatively larger than that of the polysilicon layer 204d. A difference in thickness between the polysilicon layer 204c and the polysilicon layer 204d exceeds 10%. In other embodiments, difference in thickness may be between 10% and 200%, 10% and 150%, 10% and 100%, 10% and 70%, or 10% and 40%.

Figure 2F:
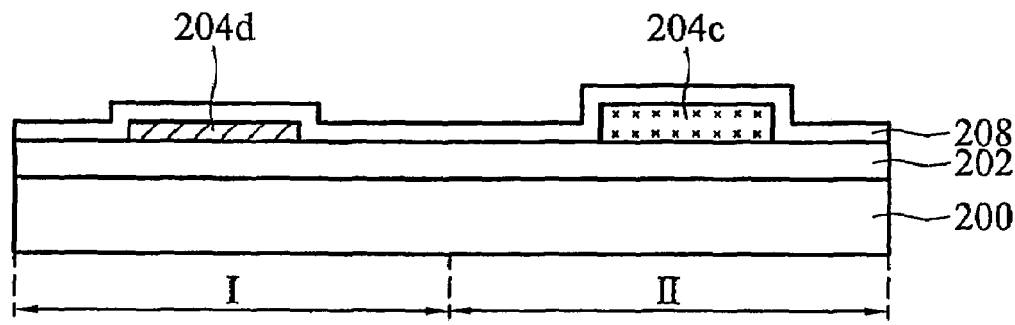

As shown in FIG. 2f, a gate insulating layer 208 is conformally deposited on the polysilicon layer 204c, the polysilicon layer 204d and the buffer layer 202.

Figure 2G:
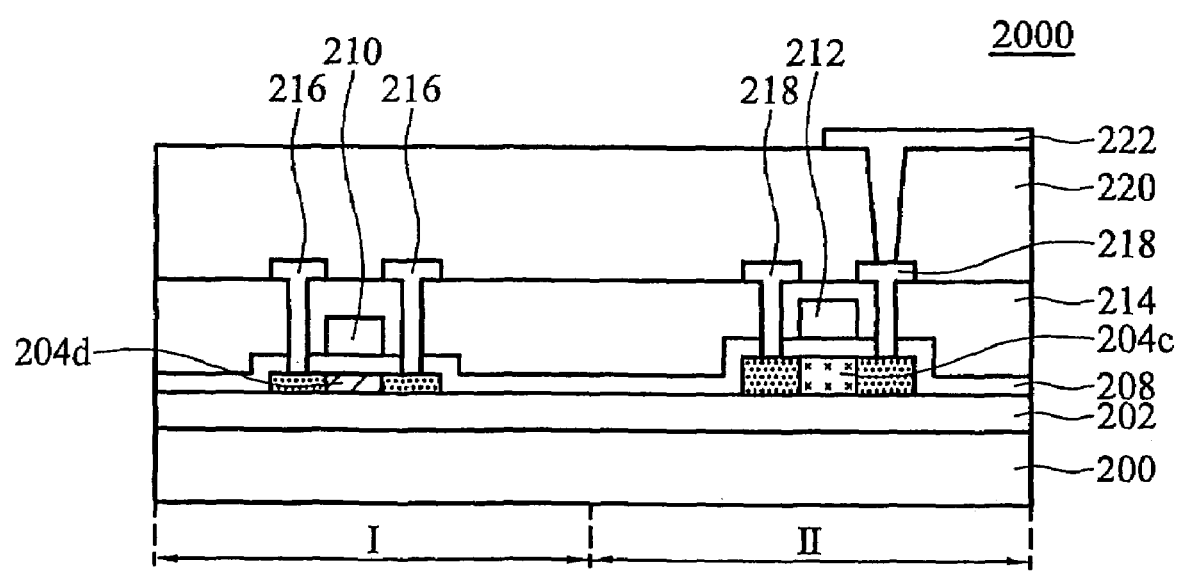

As shown in FIG. 2g, well known subsequent processes are performed to obtain the resultant active matrix organic electroluminescent device 2000 including a switching TFT in the switching region I, a driving TFT in the driving region II, a dielectric layer 214, a passivation layer 220, an anode 222, and other elements (not shown). The switching TFT comprises the polysilicon layer 204d, the gate insulating layer 208, the gate 210, the dielectric layer 214, and source/drain electrodes 216; the driving TFT comprises the polysilicon layer 204c, the gate insulating layer 208, the gate 212, the dielectric layer 214, and source/drain electrodes 218.

Second Embodiment

FIGS. 3a~3g are cross-sections showing an embodiment of a method for fabricating a system for displaying images incorporating an active matrix organic electroluminescent device.

Figure 3A:
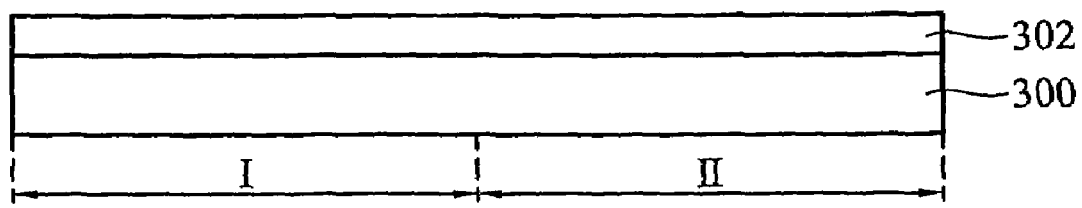
FIGS. 3a~3g are cross-sections showing an embodiment of a method for fabricating a system for displaying images incorporating an active matrix organic electroluminescent device.

As shown in FIG. 3a, a substrate 300, e.g. a glass substrate, a quartz substrate or a plastic substrate, is provided with a buffer layer 302 thereon. The substrate 300 includes a switching region I and a driving region II.

Figure 3B:
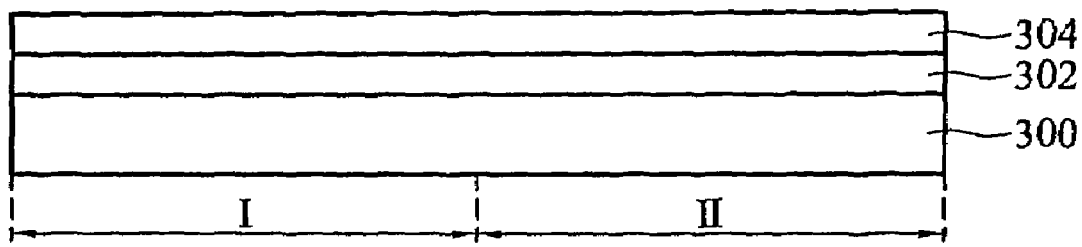

As shown in FIG. 3b, an amorphous silicon layer 304 is deposited on the buffer layer 202.

Figure 3C:
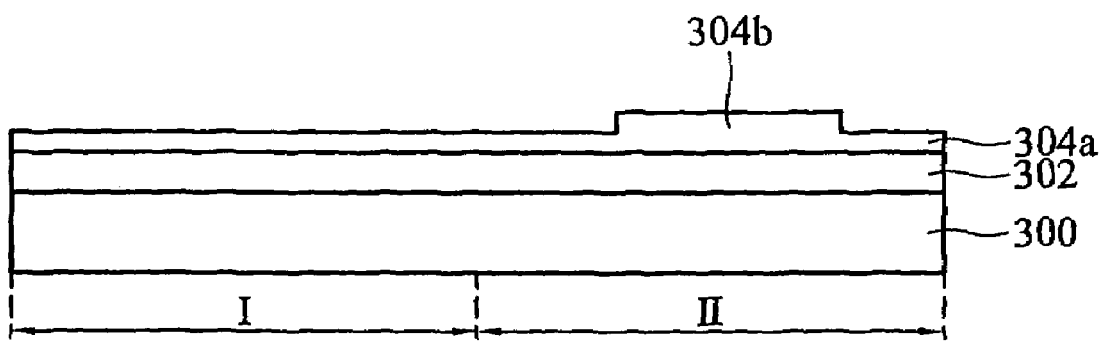

As shown in FIG. 3c, a patterned amorphous silicon layer 304a including a protrusion 304b in the driving region II is formed after a first photolithography process (not shown).

Figure 3D:
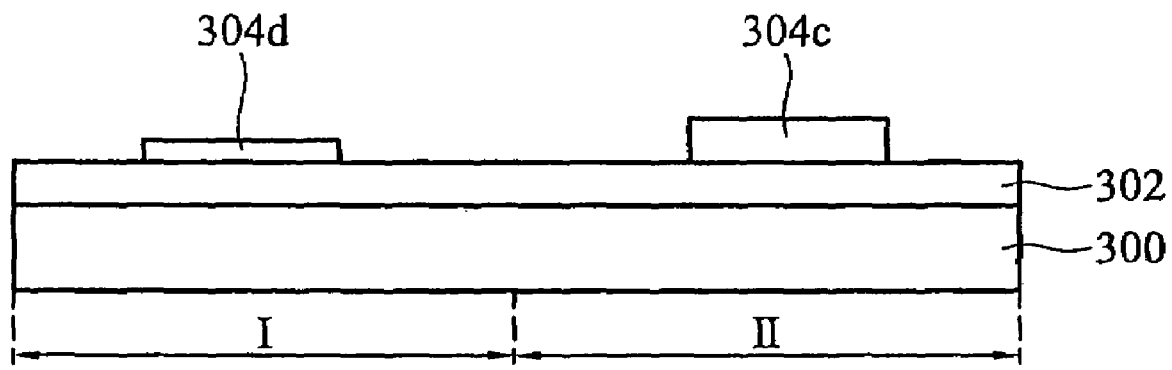

As shown in FIG. 3d, an amorphous silicon layer 304d in the switching region I and an amorphous silicon layer 304c in the driving region II are simultaneously formed by means of a second photolithography process (not shown). Specifically, the amorphous silicon layer 304c has a thickness relatively larger than that of the amorphous silicon layer 304d. A difference in thickness between the amorphous silicon layer 304c and the amorphous silicon layer 304d exceeds 10%. In other embodiments, the difference in thickness may be between 10% and 200%, 10% and 150%, 10% and 100%, 10% and 70%, or 10% and 40%.

Figure 3E:
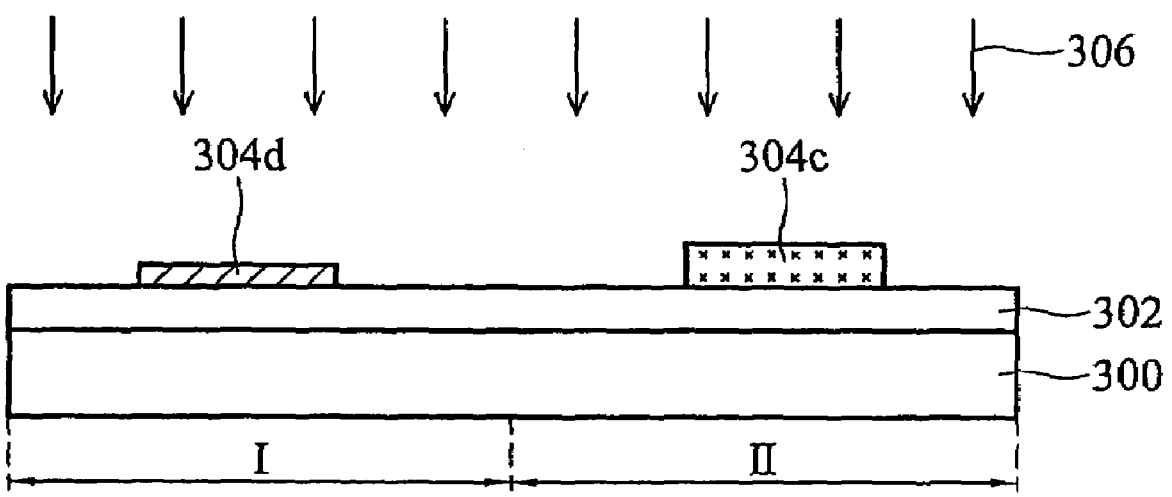

As shown in FIG. 3e, an ELA 306, i.e. eximer laser annealing, is conducted on the amorphous silicon layer 304c and the amorphous silicon layer 304d, making crystallization thereof. The grain size of the polysilicon layer 304c', i.e. crystallized amorphous silicon layer 304c' is relatively smaller than that of the polysilicon layer 304d', i.e. crystallized amorphous silicon layer 304d' due to difference in their thicknesses at a same laser energy density. In other embodiments, other crystallization treatments such as SPC or MILC can be utilized.

Figure 3F:
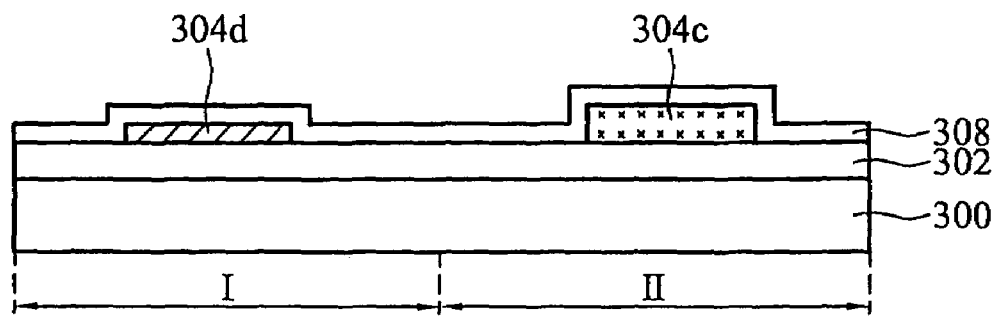

As shown in FIG. 3f, a gate insulating layer 308 is conformally deposited on the polysilicon layer 304c, the polysilicon layer 304d and the buffer layer 302.

Figure 3G:
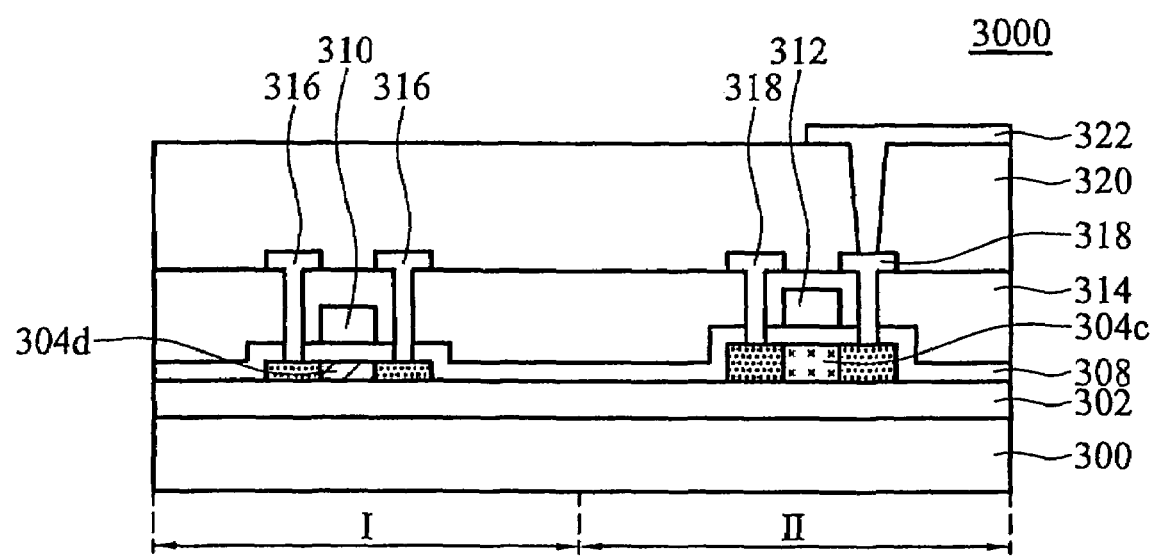

As shown in FIG. 3g, well known subsequent processes are performed to obtain the resultant active matrix organic electroluminescent device 3000 including a switching TFT in the switching region I, a driving TFT in the driving region II, a dielectric layer 314, a passivation layer 320, an anode 322, and other elements (not shown). The switching TFT comprises the polysilicon layer 304d, the gate insulating layer 308, the gate 310, the dielectric layer 314, and source/drain electrodes 316; the driving TFT comprises the polysilicon layer 304c, the gate insulating layer 308, the gate 312, the dielectric layer 314, and source/drain electrodes 318.

Third Embodiment

FIGS. 4a~4h are cross-sections showing an embodiment of a method for fabricating a system for displaying images incorporating an active matrix organic electroluminescent device.

Figure 4A:
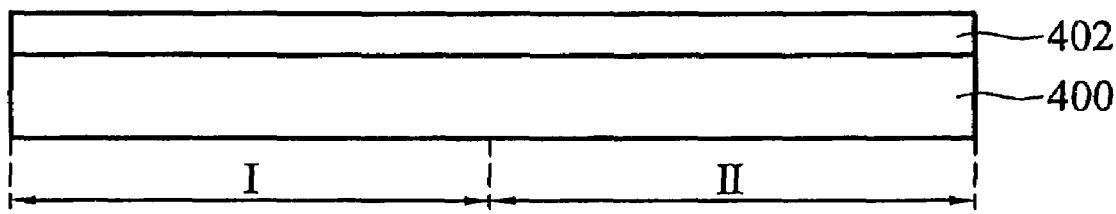
FIGS. 4a~4h are cross sections showing an embodiment of a method for fabricating a system for displaying images incorporating an active matrix organic electroluminescent device.

As shown in FIG. 4a, a substrate 400, e.g. a glass substrate, a quartz substrate or a plastic substrate, is provided with a buffer layer 402 thereon. The substrate 400 includes a switching region I and a driving region II.

Figure 4B:
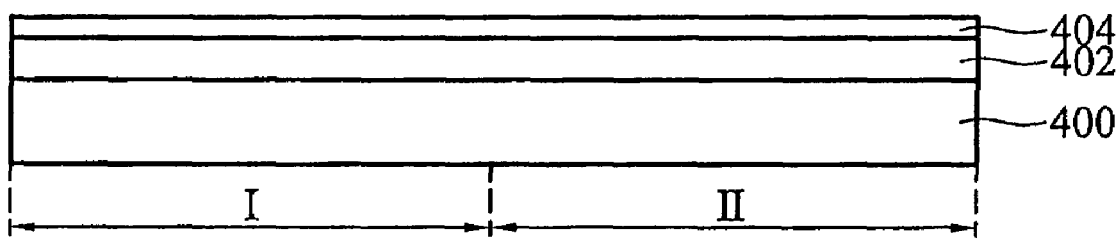

As shown in FIG. 4b, an amorphous silicon layer 404 is deposited on the buffer layer 402.

Figure 4C:
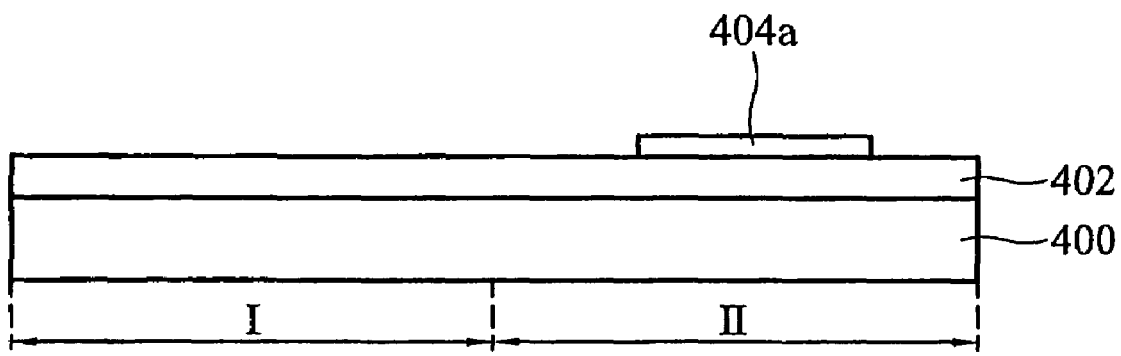

As shown in FIG. 4c, a patterned amorphous silicon layer 404a is formed in the driving region II by means of a first photolithography process (not shown).

Figure 4D:
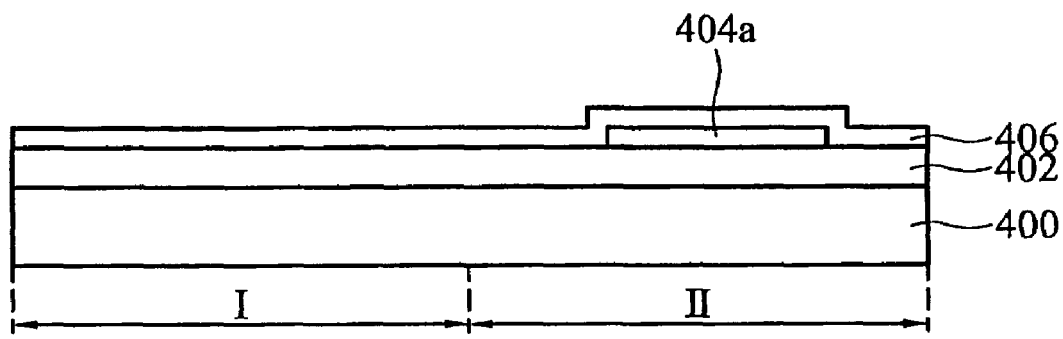

As shown in FIG. 4d, another amorphous silicon layer 406 is conformally deposited on the buffer layer 402 and the amorphous silicon layer 404a.

Figure 4E:
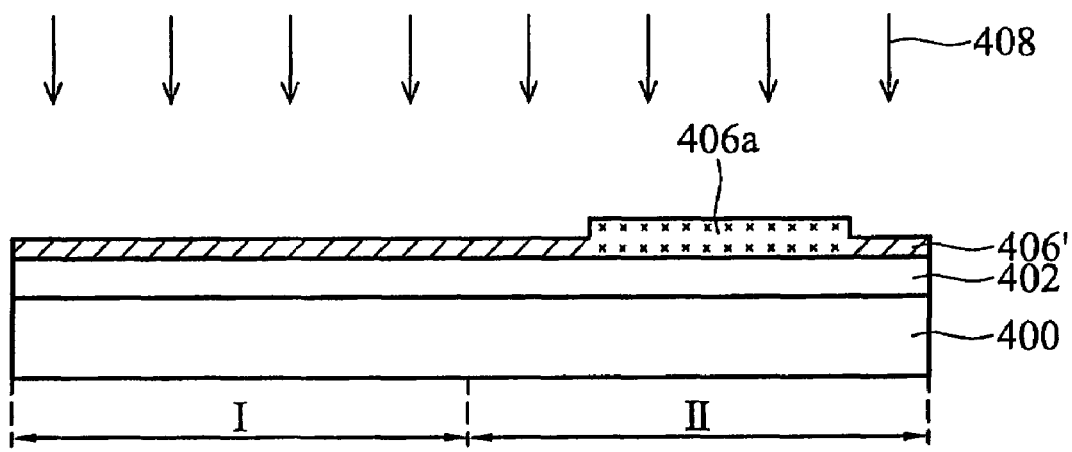

As shown in FIG. 4e, an ELA 408, i.e. eximer laser annealing, is conducted on the amorphous silicon layer 406 and the underlying amorphous silicon layer 404a, making crystallization thereof. The amorphous silicon layer 404a and the overlying amorphous silicon layer 406 are crystallized to transform a polysilicon layer 406' including a protrusion 406a. The grain size of the protrusion 406a is relatively smaller than that of the other portion of the polysilicon layer 406' due to difference in their thicknesses at a same laser energy density. In other embodiments, other crystallization treatments such as SPC or MILC can be utilized.

Figure 4F:
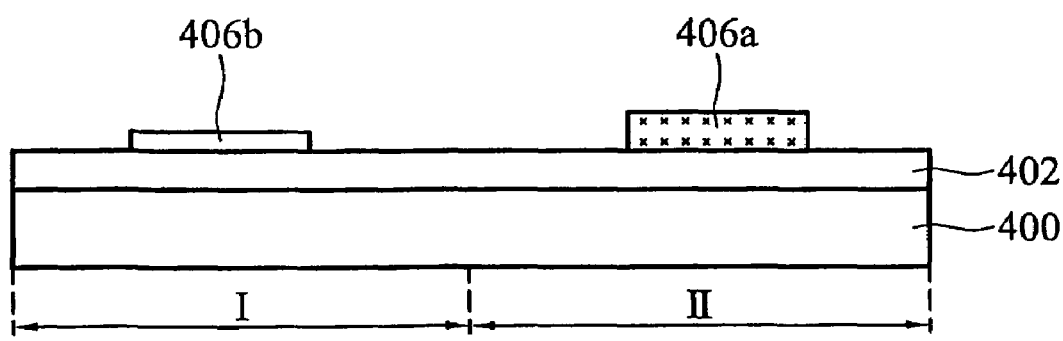

As shown in FIG. 4f, a polysilicon layer 406b in the switching region I and a polysilicon layer 406a in the driving region II are simultaneously formed by means of a photolithography process (not shown). Specifically, the polysilicon layer 406a has a thickness relatively larger than that of the polysilicon layer 406b. A difference in thickness between the polysilicon layer 406a and polysilicon layer 406b exceeds 10%. In other embodiments, difference in thickness may be between 10% and 200%, 10% and 150%, 10% and 100%, 10% and 70%, or 10% and 40%.

Figure 4G:
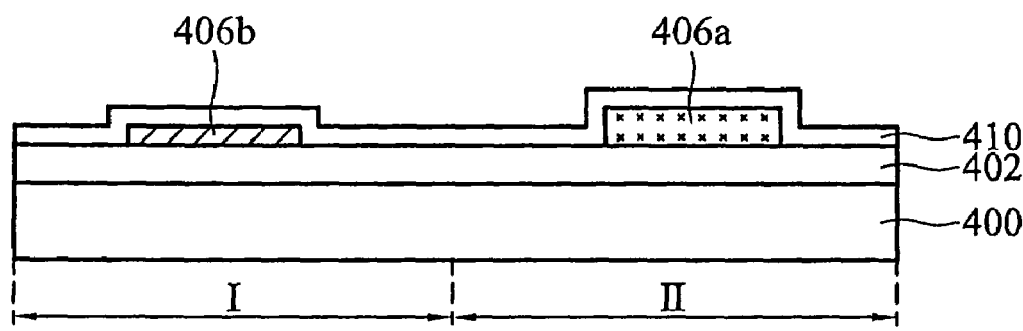

As shown in FIG. 4g, a gate insulating layer 410 is conformally deposited on the poly silicon layer 406a, the poly silicon layer 406b and the buffer layer 402.

Figure 4H:
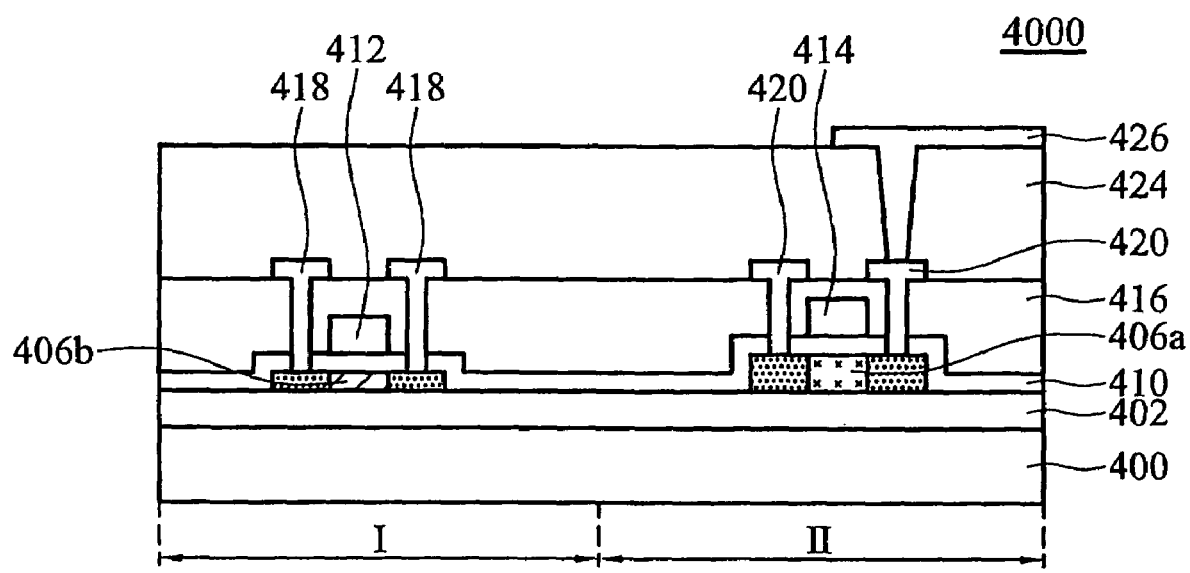

As shown in FIG. 4h, well known subsequent processes are performed to obtain the resultant active matrix organic electroluminescent device 4000 including a switching TFT in the switching region I, a driving TFT in the driving region II, a dielectric layer 416, a passivation layer 424, an anode 426, and other elements (not shown). The switching TFT comprises the polysilicon layer 406b, the gate insulating layer 410, the gate 412, the dielectric layer 416, and source/drain electrodes 418; the driving TFT comprises the polysilicon layer 406a, the gate insulating layer 410, the gate 414, the dielectric layer 416, and source/drain electrodes 420.

Figure 5:
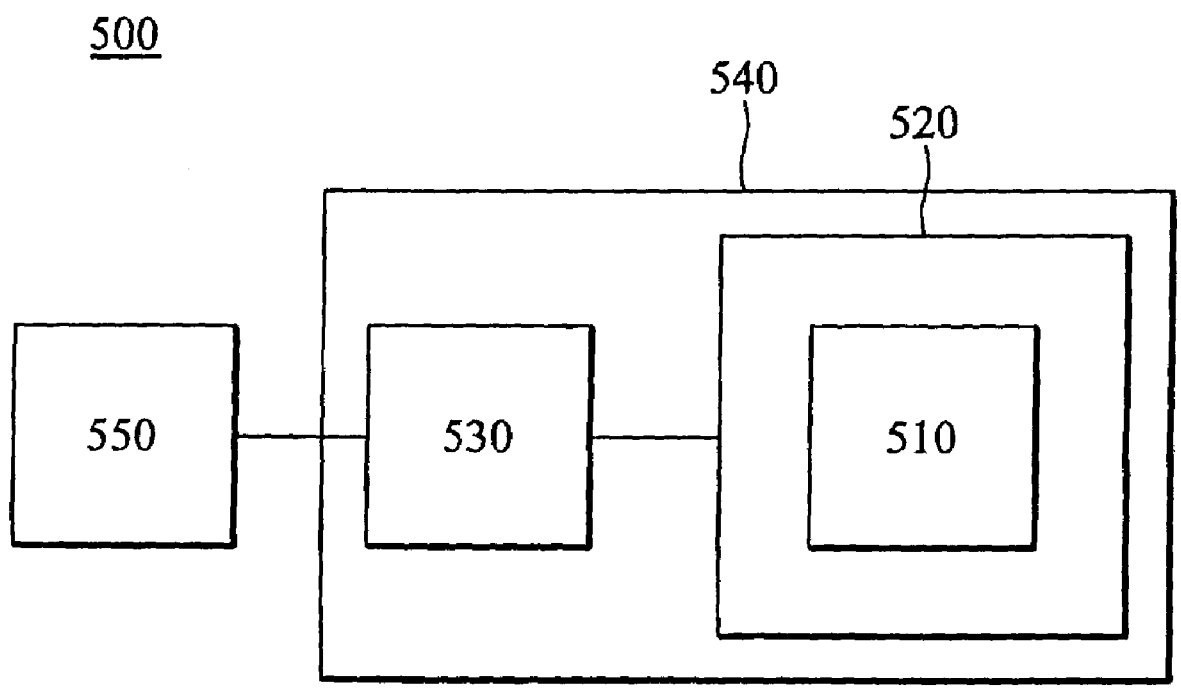
FIG. 5 schematically shows another embodiment of a system for displaying images.

FIG. 5 schematically shows another embodiment of a system for displaying images which, in this case, is implemented as a display panel 520, a flat panel device 540 or an electronic device 500. The described active matrix organic electroluminescent device can be incorporated into a display panel that can be an OLED panel. As shown in FIG. 5, the display panel 520 comprises an active matrix organic electroluminescent device 510, such as the active matrix organic electroluminescent devices 2000, 3000 and 4000 respectively shown in FIGS. 2g, 3g and 4h. In other embodiments, a flat panel device 540 can be composed of the display panel 520 and a controller 530. In other embodiments, the display panel 520 can also form a portion of a variety of electronic devices (in this case, electronic device 500). Generally, the electronic device 500 can comprise the flat panel device 540 including the display panel 520, the controller 530 and an input unit 550. Further, the input unit 550 is operatively coupled to the flat panel device 540 and provides input signals (e.g., an image signal) to the display panel 520 to generate images. The electronic device 500 can be a mobile phone, digital camera, PDA (personal digital assistant), notebook computer, desktop computer, television, car display, or portable DVD player, for example.

While the invention has been described by way of example and in terms of the embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A system for displaying images, comprising:
an active matrix electroluminescent device, comprising:
a pixel area comprising a plurality of sub-pixels, each sub-pixel comprising:
a switching region and a driving region;
a switching TFT having a first silicon layer with a first thickness in the switching region; and
a driving TFT having a second silicon layer with a second thickness in the switching region; wherein a difference between the first thickness and the second thickness at least exceeds 10%.

2. The system as claimed in claim 1, wherein the difference between the first thickness and the second thickness ranges from 10% to 200%.

3. The system as claimed in claim 1, wherein the difference between the first thickness and the second thickness ranges from 10% to 150%.

4. The system as claimed in claim 1, wherein the difference between the first thickness and the second thickness ranges from 10% to 100%.

5. The system as claimed in claim 1, wherein the difference between the first thickness and the second thickness ranges from 10% to 70%.

6. The system as claimed in claim 1, wherein the difference between the first thickness and the second thickness ranges from 10% to 40%.

7. The system as claimed in claim 1, wherein the second thickness is larger than that of the first thickness.

8. The system as claimed in claim 7, further comprising an organic light-emitting diode electrically connected to the driving TFT.

9. The system as claimed in claim 8, wherein the organic light-emitting diode comprises an anode electrode, an electroluminescent layer, and a cathode electrode.

10. The system as claimed in claim 9, further comprising a display panel, wherein the active matrix electroluminescent device forms a portion of the display panel.

11. The system as claimed in claim 10, further comprising an electronic device, wherein the electronic device comprises:
the display panel; and
an input unit coupled to the display panel and operative to provide input to the display panel such that the display panel displays images.

12. The system as claimed in claim 11, wherein the electronic device is a mobile phone, digital camera, PDA (personal digital assistant), notebook computer, desktop computer, television, car display, or portable DVD player.

* * * * *